United States Patent
Van Den Brand et al.

(10) Patent No.: US 9,174,425 B2
(45) Date of Patent: Nov. 3, 2015

(54) APPARATUS AND METHOD FOR LAMINATING A FIRST AND A SECOND SHEET

(75) Inventors: Jeroen Van Den Brand, Goirle (NL); Andreas Heinrich Dietzel, Braunschweig (DE); Sander Christiaan Broers, Weert (NL); Milan Saalmink, Veldhoven (NL)

(73) Assignee: NEDERLANDSE ORGANISATIE VOOR TOEGEPAST-NATUURWETENSCHAPPELIJK ONDERZOEK TNO, 's-Gravenhage (NL)

( * ) Notice: Subject to any disclaimer, the term of this patent is extended or adjusted under 35 U.S.C. 154(b) by 0 days.

(21) Appl. No.: 13/512,004

(22) PCT Filed: Nov. 19, 2010

(86) PCT No.: PCT/NL2010/050774
§ 371 (c)(1),
(2), (4) Date: Aug. 14, 2012

(87) PCT Pub. No.: WO2011/065819
PCT Pub. Date: Jun. 3, 2011

(65) Prior Publication Data
US 2012/0305163 A1    Dec. 6, 2012

(30) Foreign Application Priority Data

Nov. 27, 2009    (EP) .................................... 09177368

(51) Int. Cl.
*B32B 41/00*    (2006.01)
*B32B 38/18*    (2006.01)
(Continued)

(52) U.S. Cl.
CPC ............ *B32B 38/1841* (2013.01); *H01L 51/56* (2013.01); *H01L 51/0024* (2013.01); *Y10T 156/10* (2015.01)

(58) Field of Classification Search
CPC ............... H05K 13/0015; B65H 39/04; B65H 2553/04; B65H 2553/18; B65H 2553/412; B32B 2457/08; B32B 38/1841; B32B 38/1833; B32B 37/0053
USPC ........................ 156/556, 379, 582, 60, 364; 250/559.14, 559.3

See application file for complete search history.

(56) References Cited

U.S. PATENT DOCUMENTS

| 4,360,266 A | 11/1982 | Takeuchi |
| 4,491,492 A | 1/1985 | Hetherington |

(Continued)

FOREIGN PATENT DOCUMENTS

| CN | 101249739 | 8/2008 |
| DE | 102005020456 | 11/2006 |

(Continued)

OTHER PUBLICATIONS

International Search Report for PCT/NL2010/050774, mailed Mar. 11, 2011, 3 pages.

(Continued)

*Primary Examiner* — Michael N Orlando
*Assistant Examiner* — Marta Dulko
(74) *Attorney, Agent, or Firm* — Morrison & Foerster LLP

(57) ABSTRACT

The invention relates to an apparatus for laminating a first and a second sheet with a plane carrier (10) and a drum shaped carrier (20) for carrying a respective sheet. The apparatus has a first main operational mode wherein the drum shaped carrier (20) is at distance from a first carrier surface (12) of the plane carrier (10) in said third direction (Z), and a second main operational mode wherein the drum shaped carrier (20) is close to first carrier surface to bring the first and the second sheet (1, 2) in contact with each other. In the first main operational mode the drum shaped carrier (20) is virtually rolled over the first carrier surface (12) and the sheets are mutually aligned. In the second operational mode the sheets are laminated.

5 Claims, 6 Drawing Sheets

(51) Int. Cl.
*H01L 51/56* (2006.01)
*H01L 51/00* (2006.01)

(56) References Cited

U.S. PATENT DOCUMENTS

| | | | |
|---|---|---|---|
| 5,407,519 A * | 4/1995 | Joffe et al. | 156/358 |
| 5,788,802 A | 8/1998 | Raney | |
| 6,547,229 B1 * | 4/2003 | Hanson et al. | 270/52.09 |
| 7,896,046 B2 * | 3/2011 | Park | 156/358 |
| 2004/0095546 A1 | 5/2004 | Lee et al. | |
| 2004/0095548 A1 | 5/2004 | Lim et al. | |
| 2004/0114095 A1 | 6/2004 | Lee et al. | |
| 2009/0173428 A1 | 7/2009 | Klingbeil et al. | |
| 2011/0032322 A1 * | 2/2011 | Moisa et al. | 347/220 |

FOREIGN PATENT DOCUMENTS

| | | |
|---|---|---|
| EP | 2 100 730 | 9/2009 |
| JP | 2001-282122 | 10/2001 |
| JP | 2005-246773 | 9/2005 |
| JP | 2008-110492 | 5/2008 |
| WO | WO2009/127888 * | 10/2009 |

OTHER PUBLICATIONS

Notice of Reasons for Rejection (translation) for JP 2012-541042, received Oct. 23, 2014, 3 pages.

* cited by examiner

APPARATUS AND METHOD FOR LAMINATING A FIRST AND A SECOND SHEET

CROSS-REFERENCE TO RELATED APPLICATIONS

This application is the U.S. national phase of PCT application PCT/NL2010/050774 having an international filing date of 19 Nov. 2010, which claims benefit of European patent application No. 09177368.9 filed 27 Nov. 2009. The contents of the above patent applications are incorporated by reference herein in their entirety.

BACKGROUND OF THE INVENTION

1. Field of the Invention

The present invention relates to an apparatus for laminating a first and a second sheet.

The present invention further relates to a method for laminating a first and a second sheet.

2. Related Art

Various products are fabricated by sequential addition of components to previously supplied components. An important application area is in the manufacturing of electronic components as a stack of sheets. Such an electronic product comprises for example a first sheet having OLED functionality, a second sheet comprising printed photodiodes and a third sheet comprising driver electronics. Subsequent sheets in the stack have electronic functional areas that in contact with each other perform an electronic function. In the manufacture of such electronic components it is important that mutually subsequent sheets are accurately positioned with respect to each other in order that electronic, optic or fluidic features, such as microfluidic channels in a sheet accurately contact features to cooperate therewith in the subsequent sheet.

U.S. Pat. No. 5,788,802 provides a laminator which is for registering and laminating one or more web or sheet laminae on a web substrate. Each lamina has defined, successive areas and indicia provided in predetermined positions relative to the defined areas. The laminator includes feed rollers for feeding a web substrate through the laminator along a path of travel, and an additional feed mechanism for feeding a web or sheets to a drum forming a part of the laminator. The drum is shiftable toward and away from the web substrate between an engaged position in which the drum engages the substrate, and a disengaged position in which the drum is removed from contact with the substrate. A registration system successively registers the web or each sheet on the drum with the substrate, with the defined area of the web or sheet in a desired predetermined relationship to one of the defined areas of the substrate as successive defined areas are brought into a laminating position. The registration system includes a sensing mechanism for sensing the relative positions of the indicia on the web or sheet and the substrate, and a motor is provided for rotating the drum relative to the substrate in the disengaged position of the drum to adjust the relative positions of the web or sheet and the substrate so that each defined area of the web or sheet is in the desired predetermined relationship to one of the defined areas of the substrate. The drum is shifted to the engaged position and rotated when the web or sheet on the drum is registered with the substrate to laminate the web or sheet on the substrate.

SUMMARY OF THE INVENTION

It is a purpose of the invention to provide an improved apparatus for laminating a first and a second sheet. It is a further purpose of the invention to provide an improved method for laminating a first and a second sheet.

According to a first aspect of the invention there is provided an apparatus for laminating a first and a second sheet that each has a first and a second alignment mark. The apparatus comprises a plane carrier having a first carrier surface extending in a first plane for carrying the first sheet.

The apparatus comprises a second carrier surface formed by an outer surface of a cylindrical drum shaped carrier for carrying the second sheet. The drum shaped carrier has a rotation axis arranged in a first direction aligned with the first plane.

The apparatus comprises a first translation facility for translating the first carrier surface relative to the rotation axis in a second direction aligned with the first plane and transverse to the first direction.

The apparatus further comprises a rotation facility for rotating the drum shaped carrier around the rotation axis and a second translation facility for translating the drum shaped carrier respective to the first carrier surface in a third direction transverse to the first plane.

The apparatus has a first main operational mode wherein the drum shaped carrier is at distance from the first carrier surface in said third direction, and a second main operational mode wherein the drum shaped carrier is close to first carrier surface to bring the first and the second sheet in contact with each other.

The first main operational mode has a first and a second sub-mode. In the first sub-mode the rotation axis of the drum shaped carrier has a first position in the second direction with respect to the first carrier surface and the drum shaped carrier has a first rotation angle around its rotation axis. In the second sub-mode the rotation axis of the drum shaped carrier has a second position in the second direction with respect to the first carrier surface and the drum shaped carrier has a second rotation angle around its rotation axis differing from the first rotation angle. The relative distance between the first and the second position corresponds to the circumference of an angular section of the drum shaped carrier defined by said difference in rotation angle.

The apparatus further has an alignment facility for translating and/or rotating the first carrier surface within the first plane, while maintaining the drum shaped carrier in a fixed position. The apparatus also has a sensing system for determining a first relative position of the first alignment mark of the first sheet with respect to the first alignment mark of the second sheet and for determining a second relative position of the second alignment mark of the first sheet with respect to the second alignment mark of the second sheet in the first and the second sub-mode of the first main operational mode respectively.

The apparatus also has a control facility for receiving indications of said first and said second relative position and for controlling the alignment facility on the basis of said indications. In the first operational mode the control facility controls the alignment facility to align the first alignment marks of the first and the second sheet with each other, and to align the second alignment marks of the first and the second sheet with each other. In the second main operational mode the control facility controls the translation facility and the rotation facility to cause the drum shaped carrier to perform a rolling movement over the first carrier surface or a movement equivalent thereto.

In the apparatus according to the first aspect of the invention the first carrier surface with the first sheet can be shifted in the first plane while the drum shaped carrier with the second sheet, which is kept at distance from the plane carrier, is rotated between mutually different angular positions. In this way the drum shaped carrier is virtually rolled over the first carrier surface. This makes it possible to align alignment marks at mutually remote ends of the first sheet with the corresponding alignment marks of the second sheet before actually laminating the sheets. Accordingly, the apparatus according to the first aspect of the invention allows for an improved alignment of the first and the second sheet.

Several options are possible for realizing the simultaneous rotation of the drum shaped carrier and the translation of the drum shaped carrier with respect to the first carrier surface. In an embodiment the first carrier surface is maintained in a fixed position and the drum shaped carrier is simultaneously translated and rotated. In an embodiment the rotation axis of the drum shaped carrier has a fixed location and the first translation facility is arranged for translating the first carrier surface in the second direction.

In an embodiment the sensing system comprises a visual detection facility. In this embodiment the plane carrier defines a first opening and a second opening and the cylindrical drum shaped carrier also defines a first opening and a second opening. In the first sub-mode of the first main operational mode the first openings of the plane carrier and of the drum shaped carrier are positioned opposite each other and the visual detection facility has a line of sight corresponding to a direction from one of the first openings to the other one of the first openings. In the second sub-mode of the first main operational mode the second openings of the plane carrier and of the drum shaped carrier are positioned opposite each other. The visual detection facility therein has a line of sight in a direction from one of the second openings to the other one of the second openings.

The visual detection facility may be a camera. Alternatively however a simple light detector may be sufficient, e.g. in the case that the alignment marks are formed as a hole in the sheets. The amount of light passing through the alignment marks is an indication for the degree of alignment.

In an embodiment both the first and the second alignment mark are at the same side in said first direction. This has the advantage that a single camera or other visual detection facility arranged at a fixed position is sufficient. This embodiment could be useful if the transverse dimensions of the sheets are relatively small with respect to the longitudinal dimensions. An even better alignment is obtained when the first and second alignment mark are arranged at mutually opposite sides in said first direction. In that case a camera is required having a field of view that extends over the width of the sheets. In an embodiment of the embodiment wherein the rotation axis has a fixed position in the second direction, the visual detection facility is arranged in front of the plane carrier opposite the drum shaped carrier. In this way the visual detection means can be simply mounted to a main frame of the apparatus for laminating. Alternatively the visual detection facility may be arranged inside the drum shaped carrier.

In an embodiment the apparatus comprises a photon radiation source that is arranged in the line of sight of the visual detection facility. The photon radiation source provides for a constant illumination of the alignment marks, so that influences from external light sources are minimized.

In an embodiment the plane carrier comprises fine positioning means that can be controlled independently from the first translation facility. The separate fine positioning means allow for a more rapid alignment of the sheets.

In a variant of said embodiment the plane carrier comprises a first table that is moveable in said second direction by the first translation facility and a second table forming the first carrier surface that is moveable in the first plane relative to the first table by the alignment facility.

In an embodiment the apparatus further comprises an attachment facility for actively temporarily attaching the first sheet to the first carrier surface and the second sheet to the second carrier surface. In practical embodiment attachment facility comprises a vacuum pump.

According to a second aspect of the invention there is provided a method for laminating a first and a second sheet that each has a first and a second alignment mark. The method comprises the steps of:

applying the first sheet at a first carrier surface extending in a first plane, applying the second sheet at a second carrier surface formed by an outer surface of a drum shaped carrier, the drum shaped carrier having a rotation axis being arranged at distance from the first plane, while the drum shaped carrier is in a rotational position around its rotation axis wherein the first alignment mark of the second sheet faces the first sheet applying a relative movement between the first carrier surface and the drum shaped carrier until the first alignment mark of the first sheet faces the first alignment mark of the second sheet, while the drum shaped carrier is in a rotational position around its rotation axis wherein the second alignment mark of the second sheet faces the first sheet applying a relative movement between the first carrier surface and the drum shaped carrier until the second alignment mark of the first sheet faces the second alignment mark of the second sheet, moving the drum shaped carrier in the direction of the first carrier surface rolling the drum shaped carrier over the first carrier surface to apply the first and the second sheet against each other.

BRIEF DESCRIPTION OF THE DRAWINGS

These and other aspects are described in more detail with reference to the drawing. Therein.

DETAILED DESCRIPTION OF EMBODIMENTS

Figure 1:
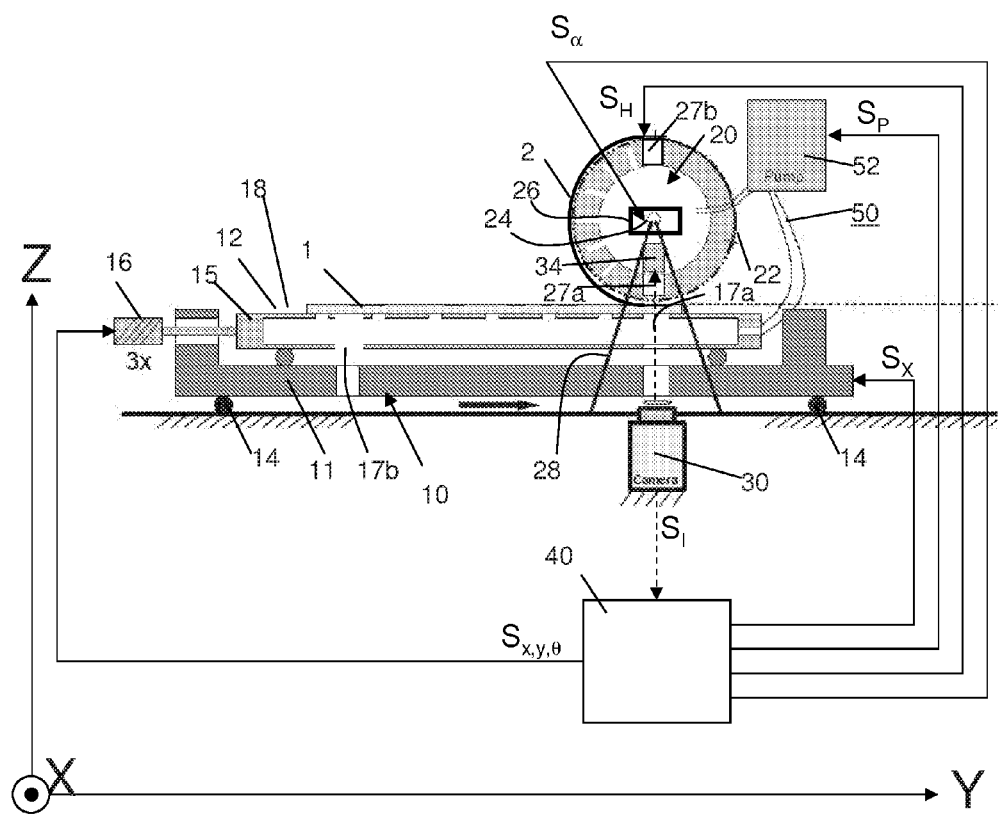
FIG. 1 schematically shows an embodiment of an apparatus according to the first aspect of the invention, FIG. 2 schematically shows an embodiment of a method according to the second aspect of the invention, FIG. 3A schematically shows the apparatus of FIG. 1 in the first sub-mode of the first mode of operation, FIG. 3B schematically shows the apparatus in the first sub-mode according to view IIIB in FIG. 3A, FIG. 3C schematically shows the apparatus in the first sub-mode according to view IIIC in FIG. 3A, FIG. 4A schematically shows the apparatus of FIG. 1 in the second sub-mode of the first mode of operation, FIG. 4B schematically shows the apparatus in the first sub-mode according to view IVB in FIG. 4A, FIG. 5 schematically shows the apparatus of FIG. 1 in the beginning of the first mode of operation, FIG. 6 schematically shows the apparatus of FIG. 1 in the end of the first mode of operation.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 3A:
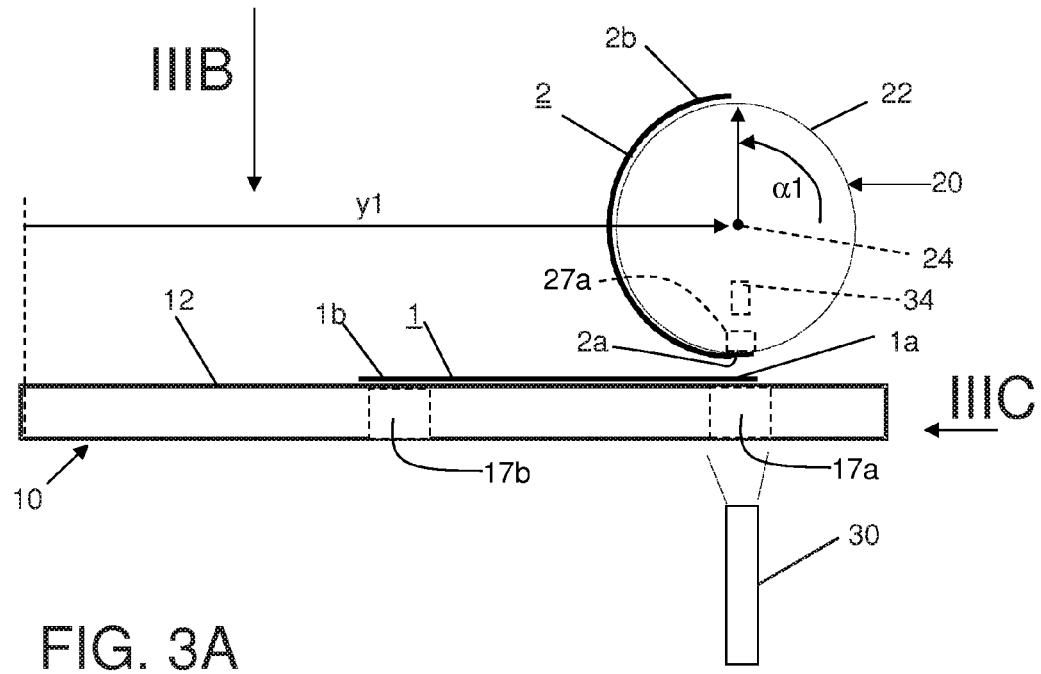
Figure 3B:
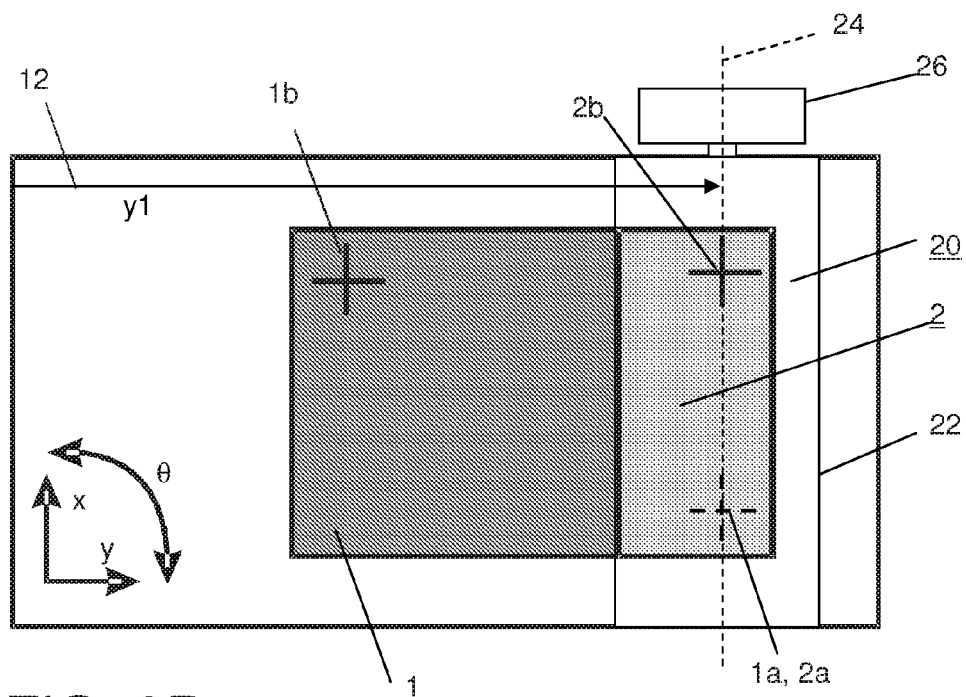
Figure 4A:
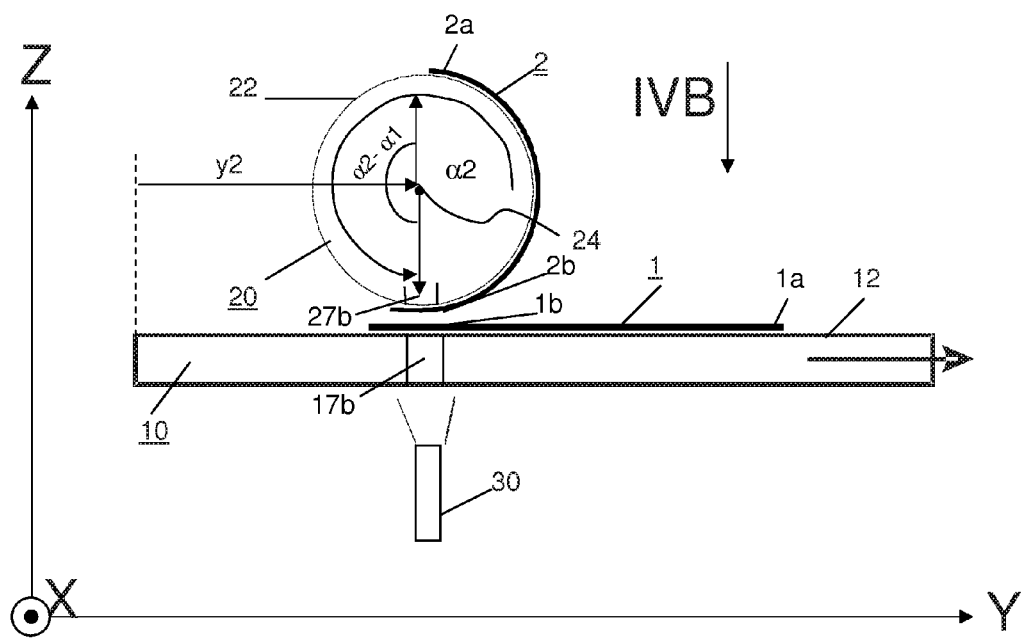
Figure 4B:
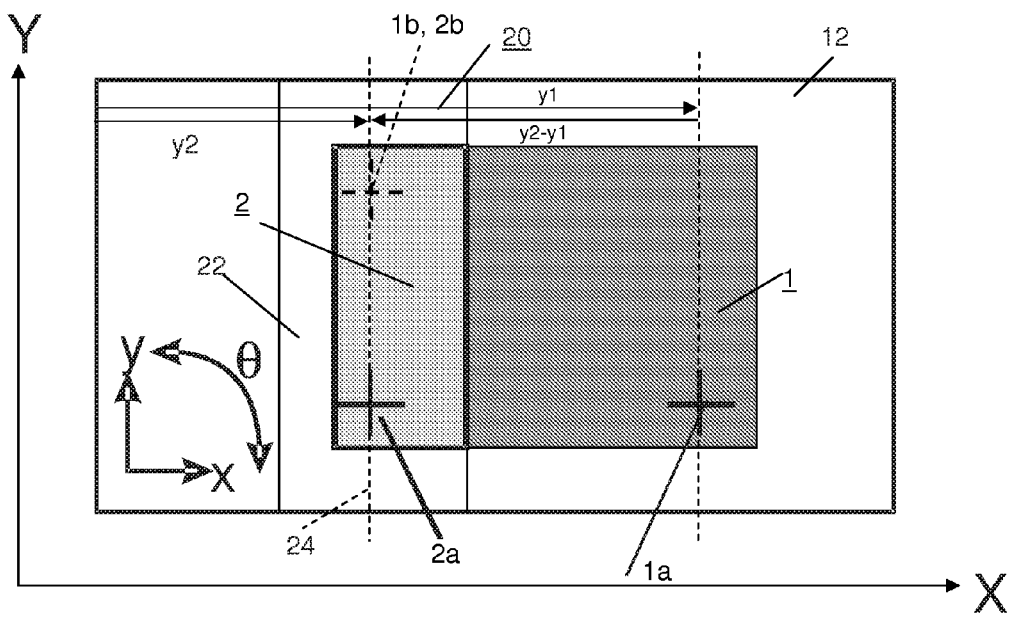

FIG. 1 schematically shows an apparatus for laminating a first and a second sheet 1,2, that each have a first and a second alignment mark 1a, 1b, 2a, 2b (See FIGS. 3B and 4B). The apparatus comprises a plane carrier 10 with a first carrier surface 12 for carrying the first sheet 1. The first carrier surface 12 defines a first plane 18. The plane carrier further defines a first opening 17a and a second opening 17b.

The apparatus has a second carrier surface 22 for carrying the second sheet 2. The second carrier surface 22 is formed by an outer surface of a cylindrical drum shaped carrier 20. The drum shaped carrier 20 has a rotation axis 24 arranged in a first direction X aligned with the first plane. The cylindrical drum shaped carrier 20 also defines a first opening 27a and a second opening 27b.

The apparatus has a first translation facility 14 for translating the first carrier surface 12 relative to the rotation axis 24 in a second direction Y aligned with the first plane 18 and transverse to the first direction X.

The apparatus further has a rotation facility 26 for rotating the drum shaped carrier 20 around the rotation axis 24.

The apparatus further has a second translation facility 28 for translating the drum shaped carrier 20 respective to the first carrier surface 12 in a third direction Z transverse to the first plane 18.

The apparatus has an alignment facility 16 for translating and/or rotating the first carrier surface 12 within the first plane 18, while maintaining the drum shaped carrier 20 in a fixed position. The first carrier surface 12 is formed by a surface of a second table 15 that is moveably arranged at a first table 11.

The apparatus further has a sensing system 30 for determining a first relative position of a first alignment mark 1a of the first sheet 1 with respect to a first alignment mark of the second sheet 2 and for determining a second relative position of the second alignment mark 1b of the first sheet 1 with respect to the second alignment mark 2b of the second sheet 2.

The apparatus further has a control facility 40 for receiving indications $S_I$ of said first and said second relative position and for controlling the alignment facility 16 by control signals $S_{x,y,\theta}$ on the basis of said indications.

The apparatus has a first and a second main operational mode. In the first main operational mode the drum shaped carrier 20 is at distance from the first carrier surface 12 in the third direction Z. In the second main operational mode the drum shaped carrier 20 is close to first carrier surface 12 to bring the first and the second sheet 1, 2 in contact with each other.

The first main operational mode has a first and a second sub-mode.

In the first sub-mode the sensing system 30 determines the first relative position of the first alignment mark 1a of the first sheet 1 with respect to the first alignment mark of the second sheet 2. In the second sub-mode the sensing system 30 determines the second relative position of the second alignment mark 1b of the first sheet 1 with respect to the second alignment mark 2b of the second sheet 2.

FIG. 1 further shows an attachment facility 50. The attachment facility 50 is capable for actively temporarily attaching the first sheet 1 to the first carrier surface 12 and the second sheet 2 to the second carrier surface 22.

Figure 2:
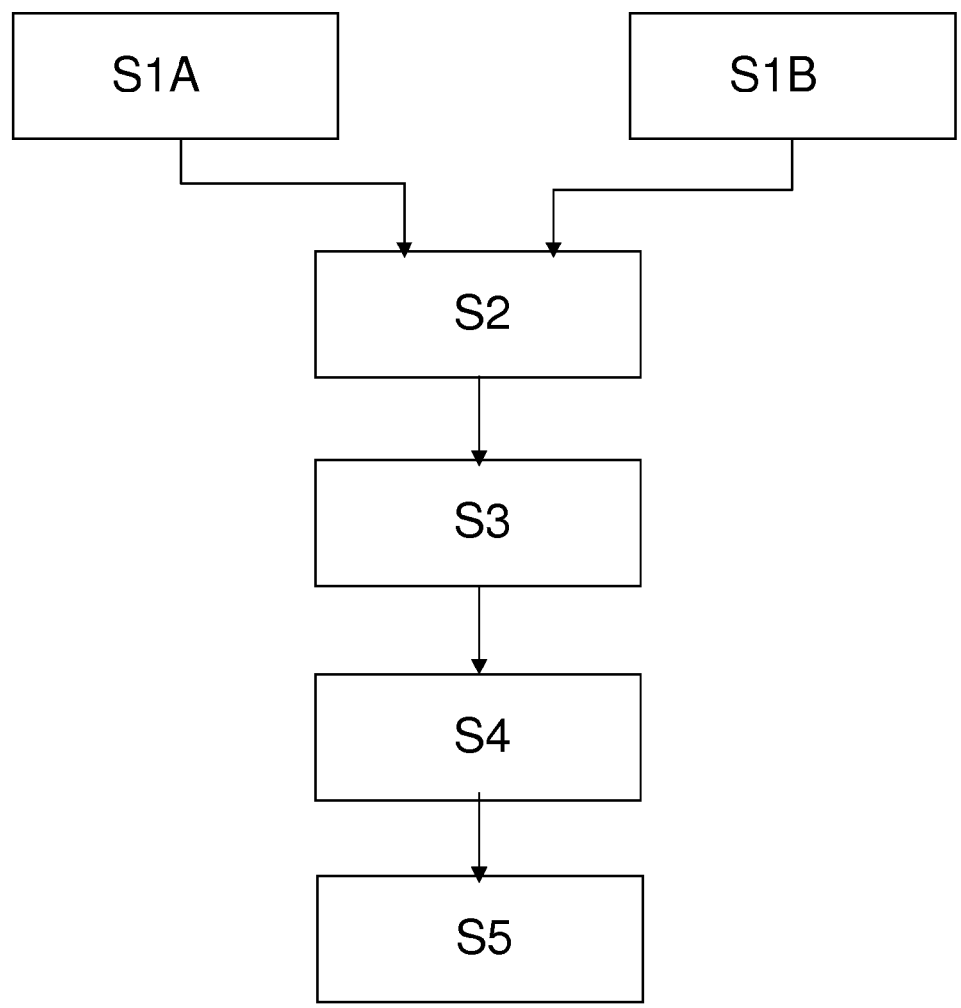

A method according to the second aspect of the invention is illustrated with reference to FIG. 2 and further with respect to FIGS. 3A, 3B, 4A, 4B and 5,6. FIG. 2 shows a first step S1A, wherein the first sheet 1 is temporarily attached to first carrier surface 12 and a second step S1B wherein the second sheet 2 is temporarily attached to second carrier surface 22 formed by the drum shaped carrier 20. Steps S1A, S1B may be carried out subsequently in arbitrary order or simultaneously. A temporary attachment of a sheet against its carrier surfaces may be realized in that the carrier surface and the sheet are sufficiently flat, so that no air can penetrate between the carrier surface and the sheet. In that case the sheet is maintained against the carrier surface by atmospheric pressure. Alternatively the temporary attachment may be actively controlled, as in the embodiment shown in FIG. 1. Therein the attachment facility 50 comprises a pump 52 that evacuates an inner space of the plane carrier 10 that communicates with openings in the first carrier surface 12. Likewise the pump 52 that evacuates an inner space of the drum shaped carrier 20 that communicates with openings in the second carrier surface 22. In this way the first sheet 1 is temporarily attached to the first carrier surface 12 and the second sheet 2 is temporarily attached to the second carrier surface 22. Separate pumps may be present for evacuating the inner space of the plane carrier 10 and of the drum shaped carrier 20.

After the sheets 1,2 are applied to their respective carrier surfaces a second step S2 is carried out wherein the drum shaped carrier is maintained in a first rotational position with respect to the second carrier surface 12 wherein the first alignment mark 2a of the second sheet 2 faces the first sheet 1. In this step S2 the relative position of the first alignment mark 1a of the first sheet 1 and the first alignment mark 1b of the second sheet 2 is determined and the first carrier surface 12 is translated until the first alignment marks 1a, 1b coincide. In the apparatus according to the invention step S2 is carried out in the first sub-mode of the first operational mode.

Subsequently step S3 is carried out in the second sub-mode of the first operational mode. Therein the drum shaped carrier 20 is in a second rotational position with respect to the second carrier surface 12 so that the second alignment mark 2b of the second sheet 2 faces the first sheet 1. In this second submode the relative position of the second alignment marks 1b, 2b is determined. The first carrier surface 12 is rotated around an axis through the first alignment mark 1a of the first sheet until the second alignment marks 1a, 1b coincide.

In step S4 the drum shaped carrier provided with the second sheet 2 is moved towards the first carrier surface 12 to bring the apparatus in its second operational mode. In the second operational mode the sheets 1,2 are in contact with each other.

In step S5 carried out in the second operational mode the second sheet 2 is laminated at the first sheet 1 by a rolling movement of the drum shaped carrier 20 with the second sheet 2 over the first carrier surface 12 with the first sheet 1 or a kinemetically equivalent relative movement. To promote that the mutually laminated sheets 1,2 remain at one of the carrier surfaces, the inner space of the corresponding carrier may be evacuated more strongly than the inner space of the other carrier surface. For example the carrier surface of the plane carrier 10 may be evacuated more strongly than that of the drum-shaped carrier 20, so that the drum-shaped carrier 20 releases the sheet 2 once it contacts the sheet 1. Instead of applying a vacuum to the entire surface of a carrier, a vacuum may be applied or cancelled segment-wise. For example release of a sheet to enable lamination with the other sheet could be promoted by a local cancelling of the evacuated state where the sheet contacts the sheet at which it should be laminated. Alternatively one of the carrier surfaces may hold the sheet by other means. To that end a carrier surface may be provided with a layer of a self-sticking rubber such as PMDS. Removal of the laminated product may be facilitated by applying air with an over pressure to the inner space of the carrier that carries the laminated product.

A method according to the second aspect of the present invention using the apparatus according to the first aspect of the invention is described now in more detail with reference to FIGS. 3A, 3B, 3C, 4A, 4B and 5,6.

Figure 3C:
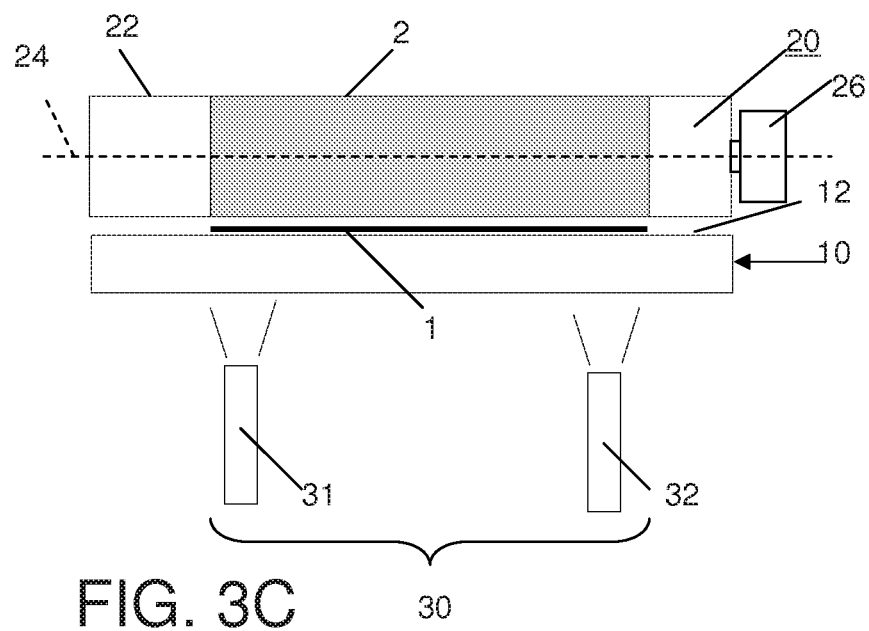

Therein FIGS. 3A, 3B and 3C show the apparatus in the first sub-mode of its first main operational mode. As can be seen in FIG. 3A, 3B, in the first sub-mode of the first operational mode the drum shaped carrier has a first rotation angle $\alpha 1$ around its rotation axis 24 so that the first alignment mark 2a of the second sheet 2 faces the first carrier surface 12.

In the first sub-mode the rotation axis 24 of the drum shaped carrier 20 has a first position y1 in the second direction Y with respect to the first carrier surface 12. By way of example the left edge of the first carrier surface is selected as the reference point from which the Y-position of the rotation axis is defined. However, any other reference point is suitable. In the embodiment shown the sensing system 30 comprises a visual detection facility 31, 32 (FIG. 3C). As can be seen in FIGS. 3A, 3B in the first sub-mode of the first main operational mode the first openings 17a, 27a of the plane carrier 10 and of the drum shaped carrier 20 are positioned opposite each other and the visual detection facility 30 has a line of sight corresponding to a direction from one of the first openings 17a, 27a to the other one 27a of the first openings. In the embodiment shown the visual detection facility 31, 32 is arranged at a side of the plane carrier 10 opposite the drum shaped carrier 20. Hence, the line of sight extends in the direction from the first opening 17a of the plane carrier 10 to the first opening 27a of the drum shaped carrier 20. This allows the sensing system 30 to determine an indication of a first relative position of the first alignment mark 1a of the first sheet 1 with respect to a first alignment mark 2a of the second sheet 2. A photon radiation source 34 is arranged inside the drum shaped carrier to illuminate the alignment marks 1a, 2a via opening 27a.

Using this indication the alignment facility 16 (see FIG. 1) is controlled to translate and/or rotate the first carrier surface 12 within the first plane, while maintaining the drum shaped carrier 20 in a fixed position until the sensing system 30 detects that the first alignment marks 1a, 2a of the first and the second sheet 1, 2 coincide.

FIGS. 4A and 4B show the apparatus in the second sub-mode of its first main operational mode. As can be seen in FIG. 4A, 4B, in the second sub-mode the second alignment mark 2b of the second sheet 2 faces the first carrier surface 12. This allows the sensing system 30 to determine a second relative position of the second alignment mark 1*b* of the first sheet 1 with respect to the second alignment mark 2*b* of the second sheet 2.

In the second sub-mode the rotation axis 24 of the drum shaped carrier 20 has a second position y2 in the second direction Y with respect to the first carrier surface 12 and the drum shaped carrier 20 has a second rotation angle α2 around its rotation axis 24, differing from the first rotation angle. The relative distance y2-y1 between the first and the second position y1, y2 corresponds to the circumference of an angular section of the drum shaped carrier defined by said difference α2-α1 in rotation angle, so that it appears as if the drum shaped carrier 20, though at distance from the first carrier surface 12 was rolled over the first carrier surface 12. It is not necessary that the relative motion of the drum shaped carrier 20 conforms to a rolling movement, as long as the result of the movement is the same as a rolling movement. For example in case of a real rolling movement the drum shaped carrier would rotate counterclockwise during its translation from position y1 to position y2.

Alternatively however the drum shaped carrier may be rotated clockwise over an angle of 360−(α2−α1) to achieve the same orientation in the second sub-mode.

As can be seen in FIGS. 4A, 4B in the second sub-mode of the first main operational mode the second openings 17*b*, 27*b* of the plane carrier 10 and of the drum shaped carrier 20 are positioned opposite each other and the visual detection facility 30 has a line of sight corresponding to a direction from one of the second openings 17*b*, 27*b* to the other one of the second openings. As in the embodiment shown the sensing system 30 is arranged at a side of the plane carrier 10 opposite the drum shaped carrier 20 the line of sight extends in the direction from the second opening 17*b* of the plane carrier 10 to the second opening 27*b* of the drum shaped carrier 20.

This allows the sensing system 30 to determine a second relative position of a second alignment mark 1*b* of the first sheet 1 with respect to the second alignment mark 2*b* of the second sheet 2.

Based on this information the control facility 40 in the first operational mode controls the alignment facility 16 to align the second alignment marks 1*b*, 2*b* of the first and the second sheet 1, 2 with each other.

The control facility 40 may realize the process of alignment for example by first shifting the first carrier surface 12 in the first sub-mode until the first alignment marks 1*a*, 2*a* of the first and the second sheet 1,2 exactly face each other. In the second sub-mode this can be followed by a rotation in the first plane 18 around alignment mark 1*a* until also the second alignment marks 1*b*, 2*b* face each other. Alternatively the apparatus may for example first align the second alignment marks 1*b*, 2*b* in the second sub-mode by shifting in the first plane 18, then return to the first sub-mode and align the first alignment marks 1*a*, 2*a* by rotating around alignment mark 1*b* in the first plane 18. If the pair of alignment marks 1*a*, 2*a* on the one hand and the pair of alignment marks 1*b*, 2*b* on the other hand cannot be matched both due to a discrepancy, the overall matching error may be minimized, for example on the basis of a least squares criterion. If it is found that the matching error cannot be minimized below a predetermined level, the apparatus may provide a warning signal.

In the embodiment shown the first translation facility 14 is separate from the alignment facility 16. This is advantageous in that the fine movements required for aligning the sheets 1, 2 can be controlled independently from the course movements necessary for carrying out the translation in the Y-direction. This is realized in that the plane carrier 10 comprises a first table 11 which has a position in the Y-direction that is controllable by a position signal Sx from the control facility 40 and a second table 15 arranged at the first table 11 for moving the first carrier surface 12 in mutually orthogonal directions x,y and rotating the first carrier surface 12 around an angle θ in the first plane 18. The second table 15 is controlled by the control facility 40 with control signals $S_{x,y,\theta}$. Instead the possibility may be considered of a plane carrier 10 having a first table 11 that is both capable of translations and rotations in the first plane 18.

Figure 5:
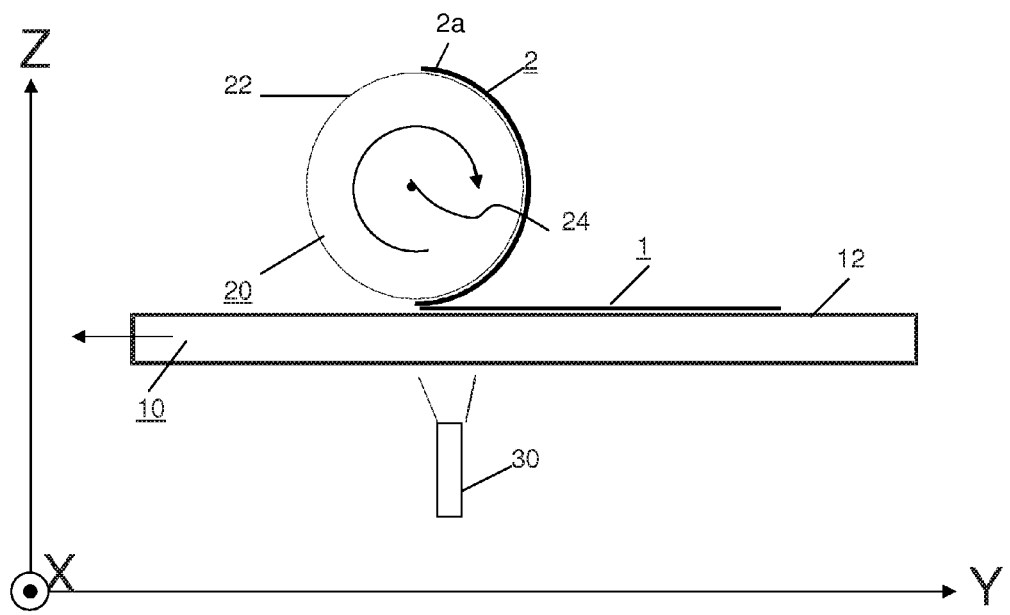
Figure 6:
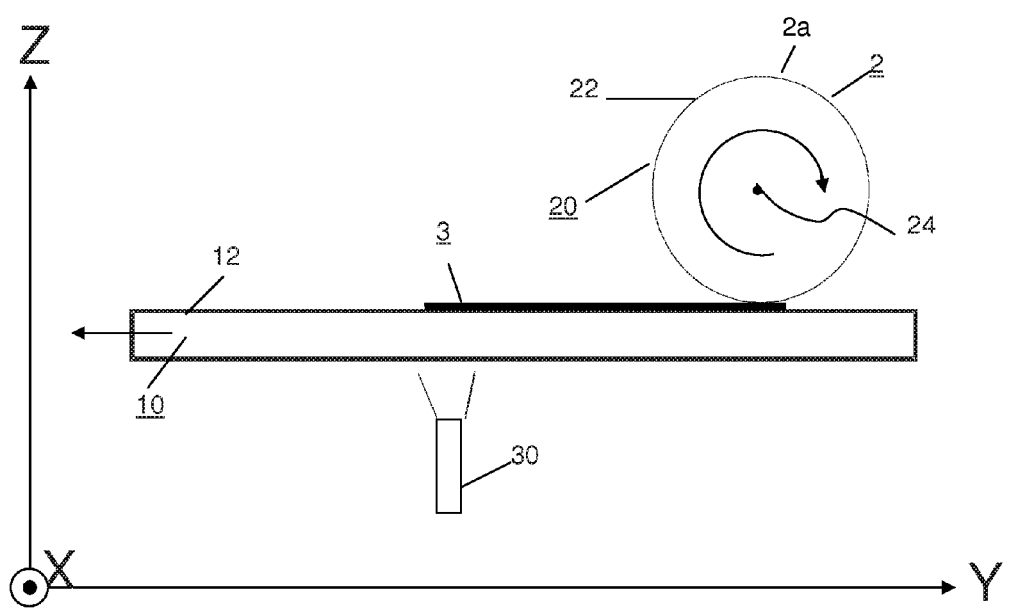

After the first and the second sheet 1,2 are aligned, the apparatus assumes the second main operational mode. In that mode, as shown in FIG. 5, the drum shaped carrier 20 is shifted close to first carrier surface 12 to bring the first and the second sheet 1, 2 in contact with each other. In the second main operational mode the control facility 40 (FIG. 1) controls the translation facility 14 (FIG. 1) and the rotation facility 26 to cause the drum shaped carrier 20 to perform a rolling movement over the first carrier surface 12. In this embodiment this is realized by having the first translation facility 14 shift the first table 11 to the left and to have the rotation facility 26 (FIG. 1) rotate the drum shaped carrier 20 clockwise to achieve the end-position shown in FIG. 6. In said end-position the sheets 1,2 are laminated with each other and form a laminated product 3. Alternatively the first translation facility may be coupled to the drum shaped carrier 20, so that the drum shaped carrier is simultaneously rotated clockwise and translated to the right in the plane of the drawing. Even an embodiment may be considered wherein the drum shaped carrier is maintained in a fixed position while the plane carrier performs all movements necessary to achieve the required relative movement between the drum shaped carrier and the plane carrier.

In case wherein one of the sheets is of a non-transparent material, the alignment marks may be provided in the form of openings in the sheets, for example as circular openings having the same size. The degree of alignment can be determined from the amount of light that passes through the openings.

One of the sheets may be of a rigid material, for example of glass, provided that this sheet is arranged at the plane carrier 10.

The control facility 40 may be implemented as dedicated hardware, as suitably programmed general purpose processor or as a combination of both.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. An apparatus for laminating a first and a second sheet that each have a first and a second alignment mark, the apparatus comprising:
   a controller configured to operate the apparatus in a first main operational mode and a second main operational mode, wherein the first main operational mode includes a first operational sub-mode and a second operational sub-mode;
   a plane carrier having a first carrier surface extending in a first plane and aligned with a first direction, wherein the first carrier surface is configured to carry the first sheet;
   a second carrier surface formed by an outer surface of a cylindrical drum shaped carrier, the drum shaped carrier having a fixed rotation axis being arranged in a second direction aligned with the first plane and transverse to the first direction, and wherein the second carrier surface is configured to carry the second sheet;

a first translator configured to translate the first carrier surface in the first direction;

a rotator;

a second translator;

an aligner;

a sensing system comprising a visual detector arranged in front of the plane carrier opposite the drum shaped carrier, a first and a second opening on the plane carrier, and a first and a second opening on the cylindrical drum, wherein the apparatus is configured such that, in the first sub-mode, the first openings of the plane carrier and of the drum shaped carrier are positioned opposite each other and the visual detector has a line of sight corresponding to a direction from one of the first openings to the other one of the first openings and, wherein the apparatus is configured such that, in the second sub-mode, the second openings of the plane carrier and of the drum shaped carrier are positioned opposite each other, and such that the visual detector has a line of sight in a direction from one of the second openings to the other one of the second openings, wherein the apparatus is further configured such that, in the first main operational mode, the drum shaped carrier is at a distance from the first carrier surface in a third direction transverse to the first plane, and such that, in the second main operational mode, the drum shaped carrier is close to the first carrier surface and wherein the first and the second sheet are in contact with each other, wherein the apparatus is further configured such that, in the first sub-mode, the rotation axis of the drum shaped carrier has a first position in the first direction with respect to the first carrier surface and the drum shaped carrier has a first rotation angle around its rotation axis, wherein the apparatus is configured such that, in the second sub-mode, the rotation axis of the drum shaped carrier has a second position in the first direction with respect to the first carrier surface and the drum shaped carrier has a second rotation angle around its rotation axis, differing from the first rotation angle, wherein the relative distance between the first and the second position corresponds to the circumference of an angular section of the drum shaped carrier defined by the difference in rotation angle, wherein the sensing system is configured to determine, in the first sub-mode, a first relative position of the first alignment mark of the first sheet with respect to the first alignment mark of the second sheet and to determine, in the second sub-mode, a second relative position of the second alignment mark of the first sheet with respect to the second alignment mark of the second sheet, wherein the controller is further configured to receive indications of the first and the second relative position and to control the aligner on the basis of the indications, wherein the controller is further configured to, in the first operational mode, control the aligner to align the first alignment marks of the first and the second sheet with each other, and to align the second alignment marks of the first and the second sheet with each other, by translating and rotating the first carrier surface within the first plane, while maintaining the drum shaped carrier in a fixed position, wherein the controller is further configured to, in the first main operational mode, subsequently control the second translator for translating the drum shaped carrier respective to the first carrier surface in the third direction, towards a position wherein the drum shaped carrier is close to the first carrier surface and wherein the first and the second sheet are in contact with each other, and wherein the controller is further configured to, in the subsequent second main operational mode, control the first translator for translating the first carrier surface relative to the rotation axis in the first direction and to control the rotator to rotate the drum shaped carrier around the rotation axis, therewith causing the drum shaped carrier to perform a rolling movement over the first carrier surface or a movement equivalent thereto.

2. The apparatus according to claim 1, wherein the plane carrier comprises a fine positioner that can be controlled independently from the first translator.

3. The apparatus according to claim 2, wherein the plane carrier comprises a first table that is moveable in said second direction by the first translator and a second table defining the first carrier surface that is moveable in the first plane relative to the first table by the aligner.

4. The apparatus according to claim 1, further comprising an attachment facility for actively temporarily attaching the first sheet to the first carrier surface and the second sheet to the second carrier surface.

5. The apparatus according to claim 1, comprising a photon radiation source that is arranged in the line of sight of the visual detector.

* * * * *